SEMICONDUCTOR ASSEMBLY METHODS

Original Filed June 26, 1953

INVENTORS.
AVAK AVAKIAN and
IRVING FEINBERG
BY
Elmer J. Nealon
ATTORNEY.

United States Patent Office 2,973,569

Patented Mar. 7, 1961

2,973,569

SEMICONDUCTOR ASSEMBLY METHODS

Irving Feinberg, Brighton, and Avak Avakian, Watertown, Mass., assignors, by mesne assignments, to Sylvania Electric Products Inc., Wilmington, Del., a corporation of Delaware

Original application June 26, 1953, Ser. No. 364,325. Divided and this application June 25, 1957, Ser. No. 667,853

4 Claims. (Cl. 29—25.3)

The present invention relates to the manufacture of semiconductor translating and transducing devices, and particularly to a novel method of mounting and preparing a semiconductor for incorporation into such devices. The invention has special application to germanium as the semiconductor. This application is a divison of our earlier filed application Serial No. 364,325, filed June 26, 1953, now abandoned, and assigned to the assignee of the present application.

Customary procedures for preparing semiconductor translators and transducers usually involve the preliminary polishing of a semiconductor element to provide a flat contact surface against which one or more rectifying-contact elements may be assembled. Before the contact surface is effective to impart the required semiconductive characteristics, the mechanically-worked surface layers must be removed, as by treatment with an appropriate semiconductor-attacking reagent.

Semiconductor materials, such as germanium, historically have been extremely difficult to etch and require extremely powerful etchants, such as an aqueous solution of hydrofluoric acid, nitric acid, and small quantities of cupric nitrate. It would be desirable if this etching operation and washing and drying of the prepared surface could be the last processing steps prior to incorporation of the germanium element into the completed semiconductor unit and following the initial mounting of the germanium chip on a support, such as a pin. The stated sequence obviates a number of production risks including the inadvertent depositing of contaminating substances on the prepared semiconductor surface incident to mounting. For example, if the etched and washed chip were mounted on its support by a soldering operation employing a corrosive flux, there is a likelihood of flux spatter reaching the prepared semiconductor surface; in the alternative, if the germanium is soldered to its support prior to etching and washing, the difficulty arises in that the powerful etching reagent tends to attack the support material resulting in contamination of the etchant and or undesirable corrosive effects on the support.

Accordingly, it is an object of the present invention to provide a novel process for preparing semiconductor elements to be incorporated into translating and transducing devices obviating one or more of the aforesaid disadvantages. Specifically, it is within the contemplation of the invention to mount a semiconductor element on a support in a manner compatible with etching by powerful reagents for the semiconductor.

Among the suggested approaches to overcoming the difficulty of attack by the etching reagent in regions other than the semiconductor surface being prepared, such as the support for the semiconductor, is the use of a protective strippable plastic mask, as of polystyrene. However, this class of material tends to absorb and retain a small but deleterious amount of the etching reagent, and involves individual handling of masked units. It is inherently difficult to apply and remove the coating, especially since the semiconductor as well as its support are extremely small.

The present invention utilizes the discovery that gold is immune to attack by the various powerful reagents for etching germanium, including the standard aqueous solution of hydrofluoric and nitric acids with cupric nitrate, even though a striking similarity exists between this standard reagent and the well-known gold solvent "aqua regia" which is a mixture of one part nitric acid with three parts hydrochloric acid. This germanium etchant includes a powerful halogen acid, hydrofluoric acid, where aqua regia uses the weaker halogen acid, hydrochloric. In two embodiments disclosed in detail below, this concept is applied by covering a semiconductor unit with gold while leaving bare only that semiconductor surface which is to be etched, and treating the whole unit with the etchant. This treatment may be carried on without precaution for the regions not to be attacked and without individual handling of the units. The gold may be electroplated, or it may be vacuum-deposited if residual traces of plating salts are to be avoided.

In accordance with one embodiment of the invention, the semiconductive element may be mounted on a support by a soldering operation involving a corrosive flux and the element and its support subsequently gold plated and exposed to the etchant. The portion of the semiconductor element to be etched is not plated with gold, or, preferably, the gold is mechanically removed from the surface to be etched.

As a further aspect of the invention, the presence of the gold as a protective mask further serves in facilitating mounting of the semiconductive element by a fluxless soldering operation, thereby eliminating the risk of contaminating the prepared semiconductor surface.

In accordance with a further embodiment of the invention, the semiconductor element may be gold-plated on one face, then etched, and finally it can be mounted in a fluxless soldering operation without fear of contaminating the etchant with the metal plating, and without fear of contaminating the carefully prepared semiconductor surface with corrosive flux.

The above and still further objects, features and advantages of the present invention will become apparent upon reference to the following detailed description of presently preferred processes, when taken in conjunction with the accompanying drawing, wherein.

Figure 1:
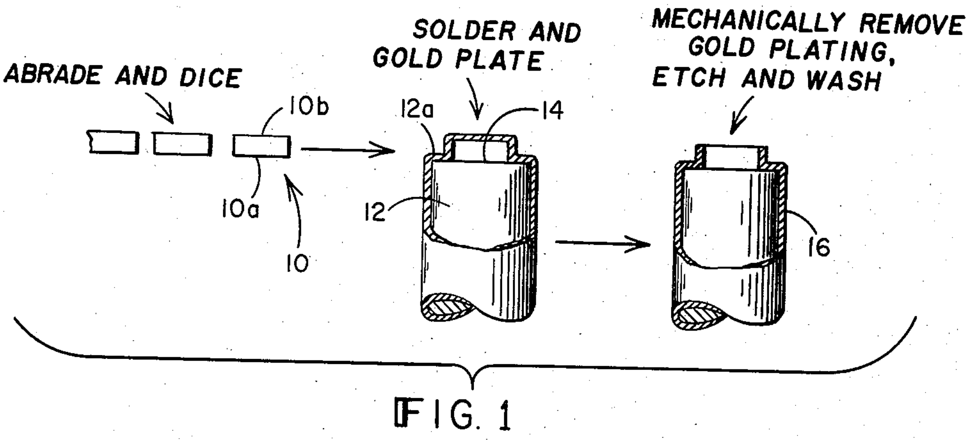
Fig. 1 is a diagrammatic showing of successive steps of mounting and preparing a semiconductor element for incorporation into a semiconductor device by one process embodying features of the invention.

Although the several methods disclosed herein will be described in conjunction with germanium as the semiconductor element, specifically in connection with the manufacture of semiconductor diodes, it is to be expressly understood that in broad concept the invention has application to other semiconductor materials such as silicon, and to multiple rectifying-contact devices such as transistors and the like. Referring now specifically to Fig. 1, there is shown a semiconductor element 10, usually a chip or wafer cut from a slab of processed germanium, which includes opposed surfaces 10*a*, 10*b*. The slab is sliced with a diamond wheel, conventionally, from a large ingot that is preferably prepared as a single crystal. In a preliminary optional operation, the surfaces 10*a*, 10*b* may be abraded. In this illustrative process, a support 12, conveniently a pin of nickel wire having a diameter of the order of .03 inch, is joined to the semiconductor element 10 by a solder joint 14 at the surface 10*a* of the semiconductor element 10 and the end face 12*a* of the pin 12. The soldering operation involves the use of known fluxes and is accomplished in accordance with techniques well understood per se. Use of a corrosive flux at this stage is of little potential harm, because the critical surface of the germanium has not yet been etched.

Thereupon, the integral assembly of the support 12 and the germanium wafer 10 are plated with a thin layer or film 16 of gold, the plating being likewise accomplished by well-known techniques. Following the plating of the entire unit with the gold, the soft plating on the surface 10*b* of the semiconductor element 10 is mechanically removed to expose the surface to be etched. As is well understood, the mechanically worked surface which is true and flat, provides a contact area for one or more rectifying contact elements and should be etched for realizing a high rectification ratio. Accordingly, the exposed surface 10*b* is subjected to an etching reagent which may be any one of the well known solvents for germanium including aqueous solutions of hydrofluoric and nitric acid having copper nitrate therein, hydrofluoric acid and hydrogen peroxide, or hydrofluoric, nitric and acetic acids and bromine. During etching, no care need be taken to avoid exposure of the gold-plated lead or support 12 to the etchant, and in fact etching is most easily accomplished by immersing the entire integral assembly of the support 12 and the semiconductor 10 in the etching bath. Consequently large numbers of these assemblies can be treated simultaneously with no individual handling required. Following etching of the exposed semiconductor surface 10*b*, the mounted crystal is washed and dried in accordance with techniques well understood and forming no part of the present invention.

Figure 3:
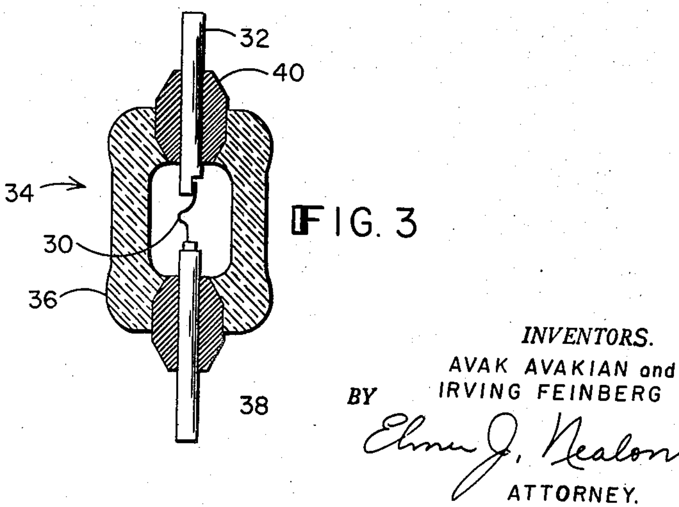
Fig. 3 is a sectional view of a typical semiconductor device, namely a rectifying-contact crystal diode, embodying a mounted semiconductor processed in accordance with the methods of either Fig. 1 or 2.

The completed sub-assembly of the supporting lead 16 and the prepared germanium crystal 10 then ready to be incorporated into a semiconductor device, such as the rectifying-contact diode of Fig. 3. Although fabrication of the semiconductor device is generally by conventional practices a substantial advantage is realized by use of the gold plated mount or lead 16. The supported crystal is advantageously incorporated into the semiconductor device by a fluxless soldering operation, as will subsequently become apparent.

Figure 2:
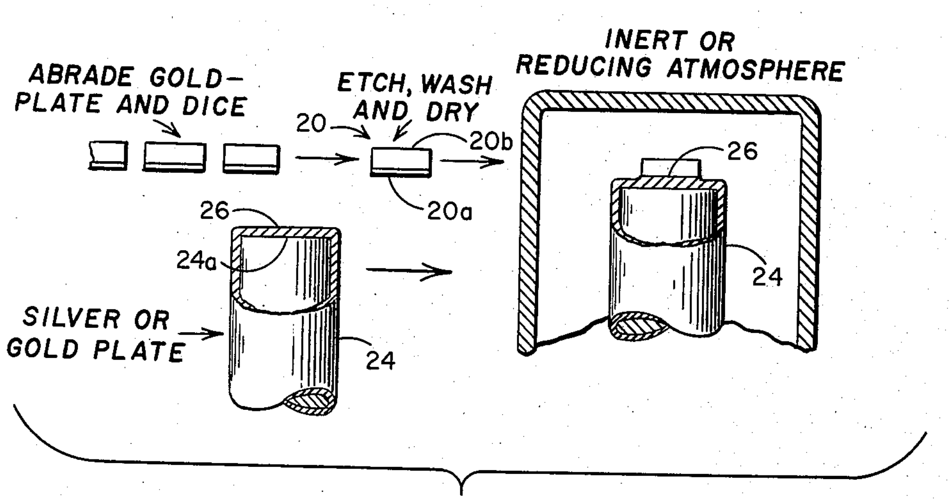
Fig. 2 is a diagrammatic showing of a modified process for the preliminary preparing and mounting of a semiconductor element.

Reference will now be made to Fig. 2 which discloses a further process for mounting and preparing a semiconductor element, such as germanium chip, preliminary to incorporation into a semiconductor translator or transducer. Specifically a germanium slab may have its opposed surfaces 20*a*, 20*b* abraded, and then gold plating 22 is applied to one surface 20*a* of the slab, after which the slab is diced into individual wafers 20. Thereafter surface 20*b* is etched, washed and dried to prepare the same for rectifying contacts. In accordance with this embodiment of the invention it is possible to throw the dice having the plating 22 on one face thereof into a bath of the etchant without fear of attacking the gold or contamination of the bath and with no individual handling. The gold forms a good ohmic low-resistance base connection to the germanium, and should be applied to the unetched germanium.

The etched, washed and dried germanium wafer 20 is then mounted on a support 24 or the like which has at least its end 24*a* provided with a tarnish-free surface. Support 24 may be wholly or predominantly of a noble metal that does not oxidize in ordinary air, or it may with economy be plated with such metal. Gold does not oxidize; and compound that may form on silver decompose at soldering heat without need for flux, especially if tin or a so-called "hard" solder is used. The joining of the respective platings 22, 26 on the semiconductor element 20 and on the pin 24 is accomplished by a fluxless soldering operation, preferably under a hood or the like and in an inert or reducing atmosphere.

Both the processes represented in Figs. 1 and 2 rely upon the property of gold to resist attack by the powerful etching reagents for germanium, serving to mask the areas not to be etched without itself being dissolved, without soaking up the reagents, and without contaminating the reagents. This same gold plating serves finally in enabling completion of the device of which the germanium and its lead is an integral part in a fluxless soldering operation.

In Fig. 3 there is shown a completed diode which embodies a pin-supported semiconductor element processed in accordance with the techniques of either Fig. 1 or Fig. 2; rectifying contact element 30 bearing against the prepared surface and supported on a lead 32; and a hermetically sealed enclosure 34 embodying a glass envelope 36 and metal lead-receiving sleeves 38, 40. With respect to the joining of the lead-supported semiconductor element to the sleeve 38, it is to be noted that the internal surfaces of the sleeve 38 advantageously is plated with a noble metal, or an appropriate noble metal alloy, enabling low-temperature soldering of the lead to the plated sleeve 38 without the use of a corrosive flux and the attendant hazard to the carefully processed semiconductor surface. This final step is effected after the rectifying contact is joined to the envelope through its metal sleeve in a soldered hermetical seal, and the final step of soldering the germanium-bearing lead to its sleeve, when effected without flux, insures preservation of the carefully etched surface free from corrosive salts. The fluxless soldering operation is effected readily, as with 60–40 tin-lead solder, in an inert or a reducing atmosphere (which may be generically designated an oxygen-free atmosphere) to facilitate soldering. Brazing in the usual sense involves excessive temperatures such as might damage the semiconductor; but high-temperature soldering as with pure tin is feasible.

The foregoing illustrative detailed description is directed to the fabrication of a hermetically sealed germanium diode. However, it will be self-evident that varied application and modification of the details will be suggested by this disclosure to those skilled in the art, and accordingly the appended claims should be accorded broad interpretation, consistent with the spirit and scope of the invention.

What is claimed is:

1. In the method of manufacturing a semiconductive device, including the steps of soldering a semiconductive element to a support, gold plating the assembly of said semiconductive element and support, mechanically removing the gold plating from one surface of said semiconductive element, and etching said one surface.

2. In the preparation of an electrical device, the steps including soldering a germanium element to a supporting lead, gold plating the assembly of said element and supporting lead, mechanically removing the gold plating from one surface of said element, treating said one surface with a germanium etchant, and forming at least one rectifying contact on said one surface.

3. In the method of manufacturing an electrical translating device, the steps which include securing a semiconductive element in electrical contact with an electrically conductive support for said element, applying a layer of gold to the surfaces of the semiconductor element and the support, removing the gold layer on a portion of the surface of the semiconductor element and exposing said surface portion to an etchant.

4. In the manufacture of a device for electrical rectification, the steps which include soldering a small semiconductor element to the end of an electrically conductive lead, plating with gold the entire exposed surface of said semiconductor element and at least the portion of said lead adjacent said element, mechanically removing the gold plating from a portion of the surface of said element, treating said surface portion with an etchant for the semiconductor material and applying a rectifying connection to surface portion.

References Cited in the file of this patent

UNITED STATES PATENTS

| | | |
|---|---|---|
| 2,629,767 | Nelson et al. | Feb. 24, 1953 |
| 2,713,132 | Matthews et al. | July 12, 1955 |
| 2,829,422 | Fuller | Apr. 8, 1958 |